(12) United States Patent
Weng et al.

(10) Patent No.: US 8,110,916 B2
(45) Date of Patent: Feb. 7, 2012

(54) CHIP PACKAGE STRUCTURE AND MANUFACTURING METHODS THEREOF

(75) Inventors: Chaofu Weng, Tainan (TW); Yi Ting Wu, Chiayi (TW)

(73) Assignee: Advanced Semiconductor Engineering, Inc., Kaosiung (TW)

( * ) Notice: Subject to any disclaimer, the term of this patent is extended or adjusted under 35 U.S.C. 154(b) by 143 days.

(21) Appl. No.: 12/648,270

(22) Filed: Dec. 28, 2009

(65) Prior Publication Data

US 2010/0320593 A1    Dec. 23, 2010

(30) Foreign Application Priority Data

Jun. 19, 2009   (TW) .............................. 98120583 A

(51) Int. Cl.
*H01L 23/48* (2006.01)

(52) U.S. Cl. ........ 257/693; 257/698; 257/734; 257/773; 257/776; 257/E23.01; 257/E21.506; 438/109; 438/124

(58) Field of Classification Search .................. 257/693, 257/698, E23.01, 690, 734, 773, 776, E21.506; 438/109, 124
See application file for complete search history.

(56) References Cited

U.S. PATENT DOCUMENTS

| | | |
|---|---|---|
| 3,959,874 A | 6/1976 | Coucoulas |
| 4,783,695 A | 11/1988 | Eichelberger et al. |
| 5,019,535 A | 5/1991 | Wojnarowskiet al. |
| 5,091,769 A | 2/1992 | Eichelberger |
| 5,111,278 A | 5/1992 | Eichelberger |
| 5,120,678 A | 6/1992 | Moore et al. |
| 5,149,662 A | 9/1992 | Eichelberger |
| 5,151,776 A | 9/1992 | Wojnarowski et al. |
| 5,157,589 A | 10/1992 | Cole, Jr. et al. |
| 5,225,023 A | 7/1993 | Wojnarowski et al. |
| 5,241,456 A | 8/1993 | Marcinkiewicz et al. |
| 5,250,843 A | 10/1993 | Eichelberger |
| 5,315,486 A | 5/1994 | Fillion et al. |
| 5,324,687 A | 6/1994 | Wojnarowski |
| 5,353,195 A | 10/1994 | Fillion et al. |
| 5,353,498 A | 10/1994 | Fillion et al. |
| 5,422,513 A | 6/1995 | Marcinkiewicz et al. |
| 5,519,936 A | 5/1996 | Andros et al. |
| 5,527,741 A | 6/1996 | Cole et al. |
| 5,546,654 A | 8/1996 | Wojnarowski et al. |

(Continued)

OTHER PUBLICATIONS

IMBERA Corp., IMB Technology.

(Continued)

*Primary Examiner* — Jasmine Clark
(74) *Attorney, Agent, or Firm* — Cooley LLP

(57) ABSTRACT

A chip package structure includes a chip module, a plurality of pre-patterned structures, a filling material layer, and a redistribution layer. The chip module includes a chip including an upper surface, a side surface, and an active surface. The pre-patterned structures are disposed around the chip. Each of the pre-patterned structures includes a circuit, a first surface, an upper surface opposite the first surface, and a side surface. The filling material layer encapsulates the chip and the pre-patterned structures. The filling material layer includes a second surface, and encapsulates the upper and side surfaces of the chip, and the upper and side surfaces of each of the pre-patterned structures. The active surface, each first surface, and the second surface are substantially co-planar. The redistribution layer is disposed on the active surface, each first surface, and the second surface. The redistribution layer electrically connects the chip and each circuit.

20 Claims, 9 Drawing Sheets

U.S. PATENT DOCUMENTS

| | | | |
|---|---|---|---|
| 5,554,887 | A | 9/1996 | Sawai et al. |
| 5,567,656 | A | 10/1996 | Chun |
| 5,703,400 | A | 12/1997 | Wojnarowski et al. |
| 5,710,062 | A | 1/1998 | Sawai et al. |
| 5,745,984 | A | 5/1998 | Cole, Jr. et al. |
| 5,834,340 | A | 11/1998 | Sawai et al. |
| 5,841,193 | A | 11/1998 | Eichelberger |
| 5,866,952 | A | 2/1999 | Wojnarowski et al. |
| 6,046,071 | A | 4/2000 | Sawai et al. |
| 6,080,932 | A | 6/2000 | Smith et al. |
| 6,159,767 | A | 12/2000 | Eichelberger et al. |
| 6,232,151 | B1 | 5/2001 | Ozmat et al. |
| 6,239,482 | B1 | 5/2001 | Fillion et al. |
| 6,265,765 | B1 | 7/2001 | DiStefano et al. |
| 6,294,741 | B1 | 9/2001 | Cole, Jr. et al. |
| 6,306,680 | B1 | 10/2001 | Fillion et al. |
| 6,358,780 | B1 | 3/2002 | Smith et al. |
| 6,377,461 | B1 | 4/2002 | Ozmat et al. |
| 6,396,148 | B1 | 5/2002 | Eichelberger et al. |
| 6,426,545 | B1 | 7/2002 | Eichelberger et al. |
| 6,486,006 | B2 | 11/2002 | Hirano et al. |
| 6,555,908 | B1 | 4/2003 | Eichelberger |
| 6,680,529 | B2 | 1/2004 | Chen et al. |
| 6,701,614 | B2 | 3/2004 | Ding et al. |
| 6,818,544 | B2 | 11/2004 | Eichelberger et al. |
| 6,838,776 | B2 | 1/2005 | Leal et al. |
| 6,845,554 | B2 | 1/2005 | Frankowsky et al. |
| 6,921,683 | B2 | 7/2005 | Nakayama |
| 6,921,975 | B2 | 7/2005 | Leal et al. |
| 6,953,708 | B2 | 10/2005 | Hedler et al. |
| 6,991,966 | B2 | 1/2006 | Tuominen |
| 7,015,075 | B2 | 3/2006 | Fay et al. |
| 7,045,908 | B2 | 5/2006 | Ohsumi |
| 7,048,450 | B2 | 5/2006 | Beer et al. |
| 7,087,991 | B2 * | 8/2006 | Chen et al. ............ 257/700 |
| 7,091,595 | B2 | 8/2006 | Fuergut et al. |
| 7,112,467 | B2 | 9/2006 | Eichelberger et al. |
| 7,145,228 | B2 * | 12/2006 | Yean et al. ............ 257/698 |
| 7,163,843 | B2 | 1/2007 | Kiendl et al. |
| 7,294,529 | B2 | 11/2007 | Tuominen |
| 7,294,791 | B2 | 11/2007 | Danoski et al. |
| 7,299,546 | B2 | 11/2007 | Tuominen et al. |
| 7,344,917 | B2 | 3/2008 | Gautham |
| 7,361,987 | B2 | 4/2008 | Leal et al. |
| 7,364,944 | B2 | 4/2008 | Huang et al. |
| 7,371,617 | B2 | 5/2008 | Tsai et al. |
| 7,425,464 | B2 | 9/2008 | Fay et al. |
| 7,453,148 | B2 | 11/2008 | Yang et al. |
| 7,476,563 | B2 | 1/2009 | Mangrum et al. |
| 7,482,198 | B2 | 1/2009 | Bauer et al. |
| 7,501,310 | B2 | 3/2009 | Yang et al. |
| 7,511,365 | B2 * | 3/2009 | Wu et al. ............ 257/676 |
| 7,514,767 | B2 | 4/2009 | Yang |
| 7,575,173 | B2 | 8/2009 | Fuergut et al. |
| 7,588,951 | B2 | 9/2009 | Mangrum et al. |
| 7,595,226 | B2 | 9/2009 | Lytle et al. |
| 7,609,527 | B2 | 10/2009 | Tuominen et al. |
| 7,619,304 | B2 | 11/2009 | Bauer et al. |
| 7,619,901 | B2 | 11/2009 | Eichelberger et al. |
| 7,622,733 | B2 | 11/2009 | Fuergut et al. |
| 7,655,501 | B2 | 2/2010 | Yang et al. |
| 7,662,667 | B2 | 2/2010 | Shen |
| 7,667,318 | B2 | 2/2010 | Yang et al. |
| 7,675,157 | B2 * | 3/2010 | Liu et al. ............ 257/690 |
| 7,692,286 | B1 | 4/2010 | Huemoeller et al. |
| 7,714,431 | B1 | 5/2010 | Huemoeller et al. |
| 7,732,242 | B2 | 6/2010 | Brunnbauer et al. |
| 7,741,151 | B2 | 6/2010 | Amrine et al. |
| 7,759,163 | B2 | 7/2010 | Kroeninger et al. |
| 7,763,976 | B2 | 7/2010 | Tang et al. |
| 7,767,495 | B2 | 8/2010 | Fuergut et al. |
| 7,812,434 | B2 | 10/2010 | Yang |
| 7,830,004 | B2 * | 11/2010 | Wu ............ 257/729 |
| 7,932,599 | B2 | 4/2011 | Kiendl et al. |
| 2004/0012099 | A1 | 1/2004 | Nakayama |
| 2006/0065387 | A1 | 3/2006 | Tonapi et al. |
| 2006/0231944 | A1 | 10/2006 | Huang et al. |
| 2007/0025092 | A1 | 2/2007 | Lee et al. |
| 2007/0131349 | A1 | 6/2007 | Tuominen et al. |
| 2007/0222054 | A1 | 9/2007 | Hembree |
| 2007/0227761 | A1 | 10/2007 | Tuominen et al. |
| 2008/0094805 | A1 | 4/2008 | Tuominen et al. |
| 2009/0014872 | A1 | 1/2009 | Tuominen et al. |
| 2009/0102066 | A1 | 4/2009 | Lee et al. |
| 2009/0133251 | A1 | 5/2009 | Tuominen et al. |
| 2009/0236686 | A1 | 9/2009 | Shim et al. |
| 2009/0261466 | A1 | 10/2009 | Pagaila et al. |
| 2010/0006330 | A1 | 1/2010 | Fu et al. |
| 2010/0006994 | A1 | 1/2010 | Shim et al. |
| 2010/0072599 | A1 | 3/2010 | Camacho et al. |
| 2010/0072618 | A1 | 3/2010 | Camacho et al. |
| 2010/0084759 | A1 | 4/2010 | Shen |
| 2010/0224983 | A1 | 9/2010 | Huang et al. |
| 2010/0308449 | A1 | 12/2010 | Yang et al. |
| 2010/0314746 | A1 | 12/2010 | Hsieh et al. |
| 2011/0018118 | A1 | 1/2011 | Hsieh et al. |
| 2011/0018124 | A1 | 1/2011 | Yang et al. |
| 2011/0115060 | A1 | 5/2011 | Chiu et al. |
| 2011/0127654 | A1 | 6/2011 | Weng et al. |
| 2011/0169150 | A1 | 7/2011 | Su et al. |
| 2011/0177654 | A1 | 7/2011 | Lee et al. |
| 2011/0194265 | A1 | 8/2011 | Su et al. |

OTHER PUBLICATIONS

Ding et al., U.S. Appl. No. 12/753,840, filed Apr. 2, 2010 for "Semiconductor Device Packages with Fan-Out and with Connecting Elements for Stacking and Manufacturing Methods Thereof".

Ding et al., U.S. Appl. No. 12/753,837, filed Apr. 2, 2010 for "Wafer-Level Semiconductor Device Packages with Stacking Functionality."

Chen et al., U.S. Appl. No. 12/753,843, filed Apr. 2, 2010 for "Stacked Semiconductor Device Package Assemblies with Reduced Wire Sweep and Manufacturing Methods Thereof."

Lee et al., U.S. Appl. No. 12/972,046, filed Dec. 17, 2010 for "Embedded Component Device and Manufacturing Methods Thereof."

Hunt et al., U.S. Appl. No. 12/944,697, filed Nov. 11, 2010 for "Wafer Level Semiconductor Package and Manufacturing Methods Thereof."

Chen et al., U.S. Appl. No. 12/874,144, filed Sep. 1, 2010 for "Stackable Semiconductor Package and Manufacturing Method Thereof."

* cited by examiner

CHIP PACKAGE STRUCTURE AND MANUFACTURING METHODS THEREOF

CROSS-REFERENCE TO RELATED APPLICATION

The present application claims the benefit of Taiwan application Serial No. 98120583, filed Jun. 19, 2009, the subject matter of which is incorporated herein by reference.

FIELD OF THE INVENTION

The present invention generally relates to electronic device packaging. More particularly, the present invention relates to a chip package structure and manufacturing methods thereof.

BACKGROUND OF THE INVENTION

FIG. 1 is a schematic view showing a conventional chip package structure in accordance with prior art. A conventional single-chip or multi-chip package structure is shown. The single-chip or multi-chip package structure 100 includes at least one chip 102, a plurality of structural material layers 104, a dielectric layer 106, a plurality of solder pads 107, and a metal layer 110. A plurality of solder pads 107 are disposed on the chip 102. A plurality of structural material layers 104 are connected to a lateral side of the chip 102, wherein the surface of the structural material layer 104 is aligned with the surface of the chip 102. The dielectric layer 106 is disposed on the structural material layer 104 and the chip 102, wherein the top surface of the surface of the chip 102 is aligned with the surface of the structural material layer 104. The dielectric layer 106 has a plurality of openings 108. The metal layer 110 is disposed on the dielectric layer 106 and the side-wall of the openings 108.

In order to increase the density of electrical connections of the package structure, a through molding compound technology is typically applied to the structural material layer 104 first, such as mechanical drilling through the structural material layer 104 to enable electrical connectivity to the metal layer 110. However, at present, the through molding compound technology is costly.

SUMMARY OF THE INVENTION

Accordingly, one aspect of the present invention is directed to a chip package structure and manufacturing methods thereof. The chip package structure may be a single-chip or multi-chip package structure.

In one innovative aspect, the invention relates to a chip package structure. In one embodiment, the chip package structure includes a chip module, a plurality of pre-patterned structures, a filling material layer, and a redistribution layer. The chip module includes a chip including an upper surface, a side surface, and an active surface. The plurality of pre-patterned structures are disposed around the chip. Each of the plurality of pre-patterned structures includes a circuit, a first surface, an upper surface opposite the first surface, and a side surface. The filling material layer encapsulates the chip and the plurality of pre-patterned structures. The filling material layer includes a second surface, and encapsulates the upper surface of the chip, the side surface of the chip, the upper surface of each of the plurality of pre-patterned structures, and the side surface of each of the plurality of pre-patterned structures. The active surface, the first surface of each of the plurality of pre-patterned structures, and the second surface are substantially co-planar. The redistribution layer is disposed on the active surface, the first surface of each of the plurality of pre-patterned structures, and the second surface. The redistribution layer electrically connects the chip and the circuit in each of the plurality of pre-patterned structures.

In another innovative aspect, the invention relates to a method of forming a chip package structure. In one embodiment, the method includes providing a plurality of separate pre-patterned structures, where each of the plurality of separate pre-patterned structures includes a circuit, a first surface, an upper surface opposite the first surface, and a side surface. The method further includes providing a chip module including a chip, where the chip includes an upper surface, a side surface, and an active surface opposite the upper surface of the chip. The method further includes providing a carrier. The method further includes disposing the plurality of separate pre-patterned structures and the chip adjacent to the carrier such that the plurality of separate pre-patterned structures are positioned around the chip. The method further includes forming a filling material layer around the chip and the plurality of separate pre-patterned structures so that: (a) the filling material layer substantially covers the upper surface of the chip, the side surface of the chip, the upper surface of each of the plurality of separate pre-patterned structures, and the side surface of each of the plurality of separate pre-patterned structures; and (b) a second surface of the filling material layer is substantially co-planar with the active surface and the first surface of each of the plurality of separate pre-patterned structures. The method further includes disposing a redistribution layer on the active surface, the first surface of each of the plurality of separate pre-patterned structures, and the second surface, wherein the redistribution layer electrically connects the chip and the circuit in each of the plurality of separate pre-patterned structures.

BRIEF DESCRIPTION OF THE DRAWINGS

The accompanying drawings are included to provide a further understanding of some embodiments of the invention, and are incorporated in and constitute a part of this specification. The drawings illustrate embodiments of the invention and, together with the description, serve to explain the principles of some embodiments of the invention.

DETAILED DESCRIPTION

Figure 1:
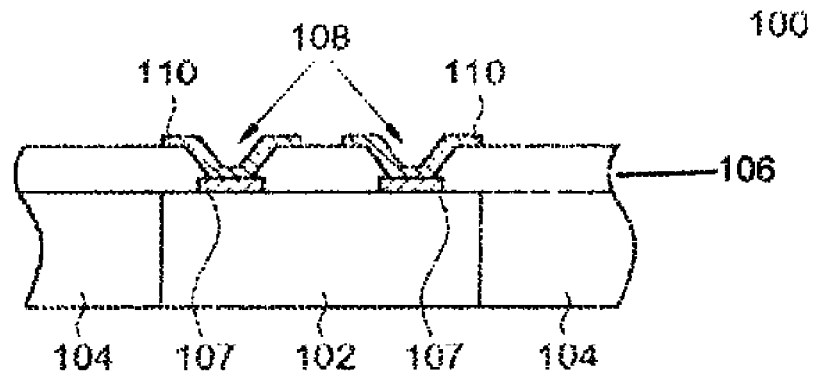
FIG. 1 is a schematic view showing a conventional chip package structure in accordance with prior art.

Reference will now be made in detail to some embodiments of the invention, examples of which are illustrated in the accompanying drawings. Wherever possible, the same reference numbers are used in the drawings and the descriptions to refer to the same or like parts.

Definitions

The following definitions apply to some of the aspects described with respect to some embodiments of the invention. These definitions may likewise be expanded upon herein.

As used herein, the singular terms "a", "an" and "the" include plural referents unless the context clearly dictates otherwise. Thus, for example, reference to a protruding metal block can include multiple protruding metal blocks unless the context clearly dictates otherwise.

As used herein, the term "set" refers to a collection of one or more components. Thus, for example, a set of layers can include a single layer or multiple layers. Components of a set also can be referred to as members of the set. Components of a set can be the same or different. In some instances, components of a set can share one or more common characteristics.

As used herein, the term "adjacent" refers to being near or adjoining. Adjacent components can be spaced apart from one another or can be in actual or direct contact with one another. In some instances, adjacent components can be connected to one another or can be formed integrally with one another.

As used herein, terms such as "inner," "top," "upper," "bottom," "above," "below," "upwardly," "downwardly," "side," and "lateral" refer to a relative orientation of a set of components, such as in accordance with the drawings, but do not require a particular orientation of those components during manufacturing or use.

As used herein, the terms "connect", "connected" and "connection" refer to an operational coupling or linking. Connected components can be directly coupled to one another or can be indirectly coupled to one another, such as via another set of components.

As used herein, the terms "substantially" and "substantial" refer to a considerable degree or extent. When used in conjunction with an event or circumstance, the terms can refer to instances in which the event or circumstance occurs precisely as well as instances in which the event or circumstance occurs to a close approximation, such as accounting for typical tolerance levels of the manufacturing operations described herein.

As used herein, the terms "conductive" refers to an ability to transport an electric current. Electrically conductive materials typically correspond to those materials that exhibit little or no opposition to flow of an electric current. One measure of electrical conductivity is in terms of Siemens per meter ("S·m$^{-1}$"). Typically, an electrically conductive material is one having a conductivity greater than about $10^4$ S·m$^{-1}$, such as at least about $10^5$ S·m$^{-1}$ or at least about $10^6$ S·m$^{-1}$. Electrical conductivity of a material can sometimes vary with temperature. Unless otherwise specified, electrical conductivity of a material is defined at room temperature.

Aspects of the present invention can be used for fabricating various package structures, such as stacked type packages, multiple-chip packages, or high frequency device packages.

According to embodiments of the chip package structure of the invention, the pre-patterned structure is placed in the structural material around the embedded chip, and at least one surface of the chip, the pre-patterned structure and the filling material layer are substantially co-planar. Embodiments of the invention are applicable to single-chip and multi-chip package structures, as well as to fan-out and fan-in package structures. Embodiments of the package structures of the invention can be conveniently stacked to form a package-on-package (POP) package.

First Embodiment

Figure 2A:
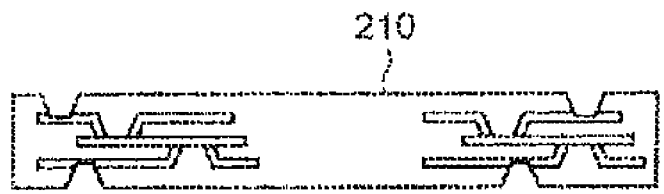
FIGS. 2A through 2M are schematic views showing a method for manufacturing a chip package structure according to a first embodiment of the invention.
Figure 2B:
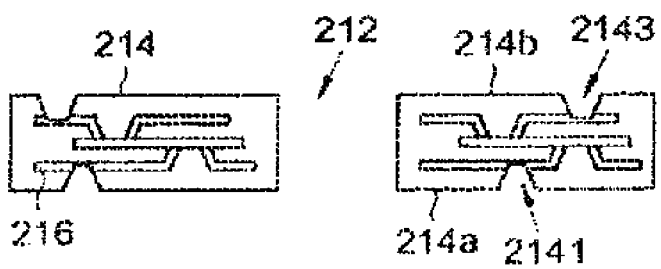
Figure 2C:
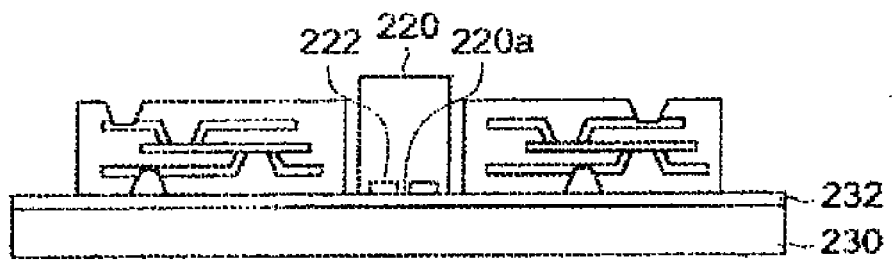
Figure 2D:
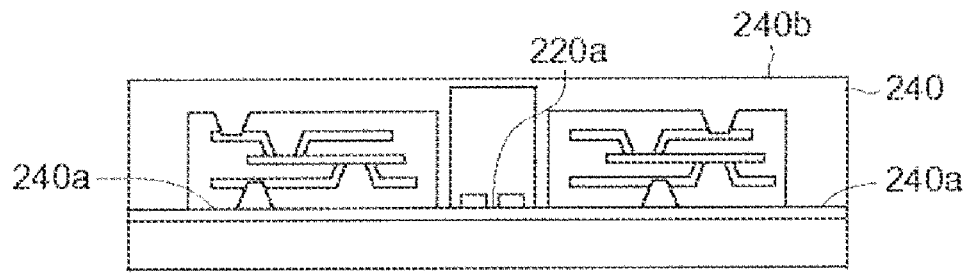
Figure 2E:
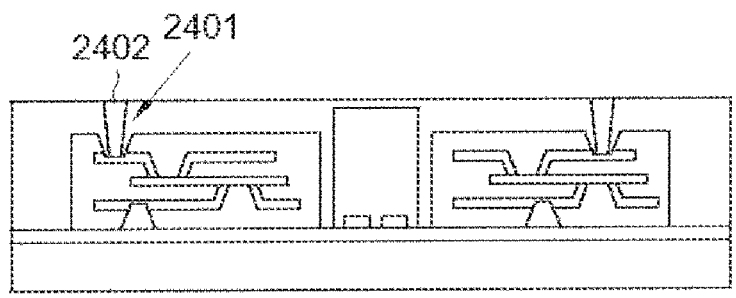
Figure 2F:
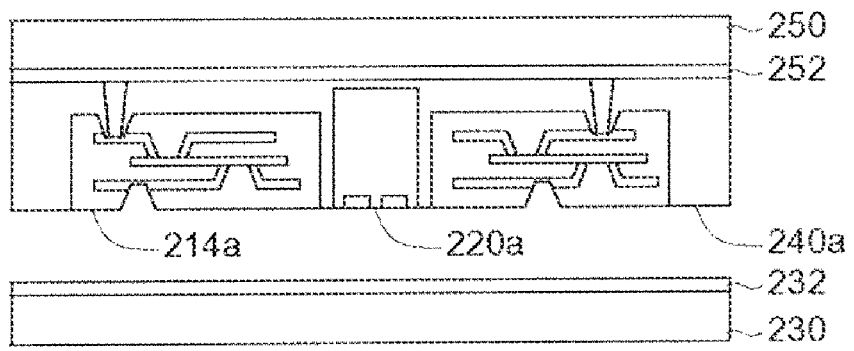
Figure 2G:
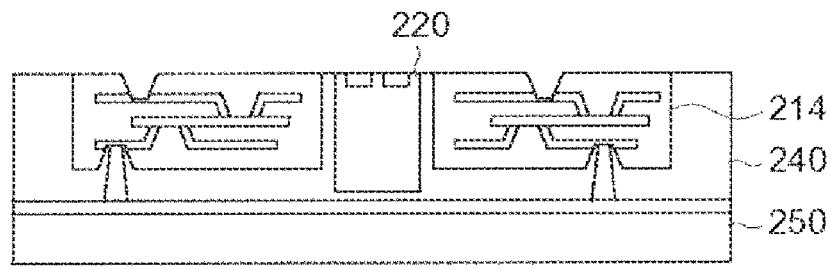
Figure 2H:
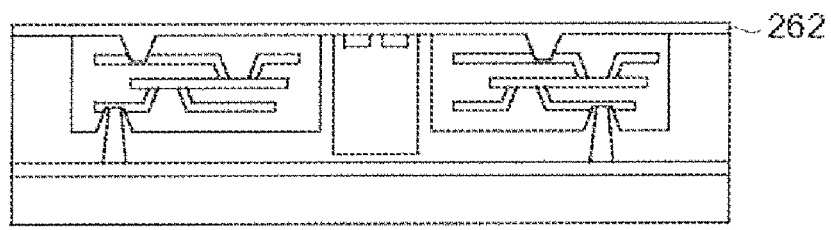
Figure 2I:
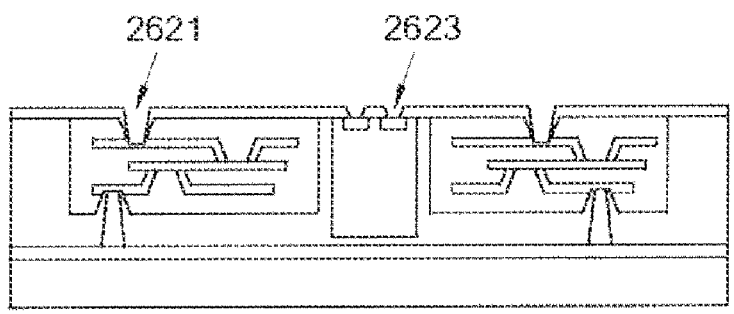
Figure 2J:
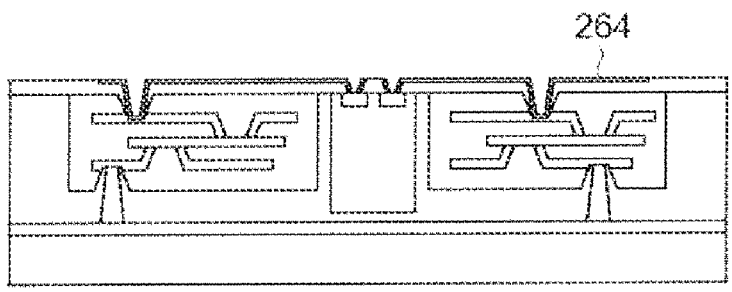
Figure 2K:
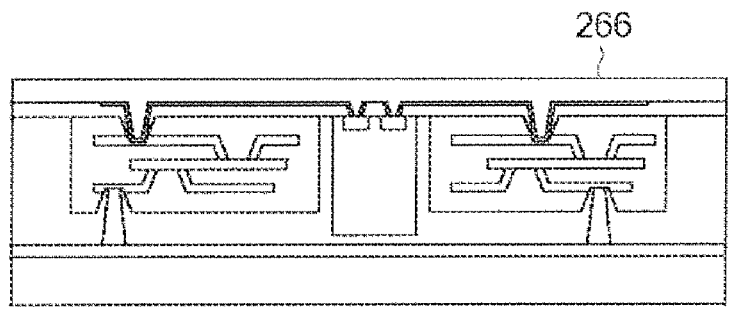
Figure 2L:
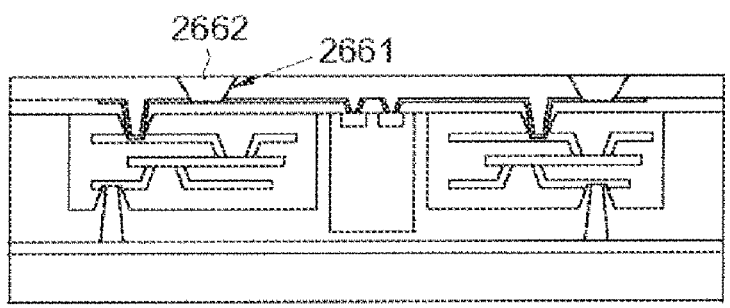
Figure 2M:
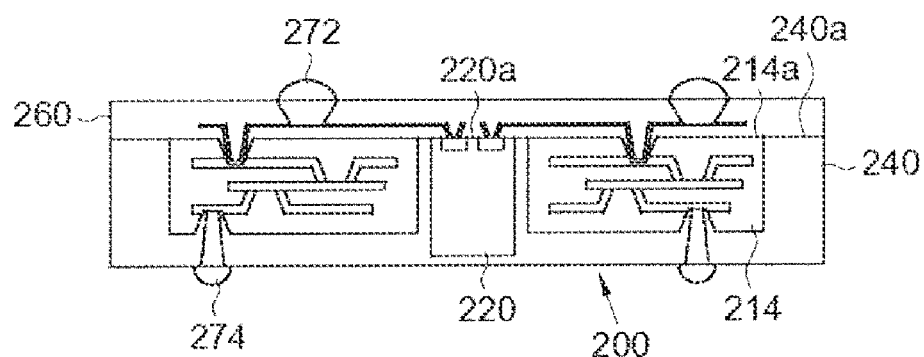

Referring to FIG. 2M, a schematic view of a method for manufacturing a chip package structure according to a first embodiment of the invention is shown. The chip package structure 200 includes a chip module, a plurality of pre-patterned structures 214, a filling material layer 240, and a redistribution layer 260. The chip module includes a chip 220 including an active surface 220a, an upper surface opposite the active surface 220a, and a side surface extending between the active surface 220a and the upper surface of the chip 220. The pre-patterned structures 214 are disposed around the chip 220. Also, referring to FIG. 2B, each of the pre-patterned structures 214 includes a circuit 216, a first surface 214a, an upper surface 214b opposite the first surface 214a, and a side surface extending between the first surface 214a and the upper surface 214b. In FIG. 2M, the filling material layer 240 encapsulates the chip 220 and the pre-patterned structures 214. The filling material layer 240 encapsulates the upper surface of the chip 220, the side surface of the chip 220, the upper surface 214b of each of the pre-patterned structures 214, and the side surface of each of the pre-patterned structures 214. The filling material layer 240 has a second surface 240a. The active surface 220a, each first surface 214a and the second surface 240a are substantially co-planar. The filling material layer 240 may be made from a photo-imageable or a non-photo-imageable material. This material is preferably but not limited to a molding compound, and other structural materials which can be used as fillers are also applicable to embodiments of the invention. The redistribution layer 260 is disposed on the active surface 220a, each first surface 214a, and the second surface 240a, and electrically connects the chip 220 and each circuit 214. Furthermore, the chip package structure 200 may further include a plurality of external connectors 272 and 274 respectively disposed on the redistribution layer 260 and the filling material layer 240.

The pre-patterned structure 214 of this embodiment of the invention is placed in the structural material around the embedded chip 200 of the chip package structure 200, and serves as a supporting structure of the package, not only increasing the density of electrical connections in small-sized packages, but also incurring lower cost than conventional through molding compound technology. Furthermore, in this embodiment of the invention, the active surface 220a, each first surface 214a and the second surface 240a are substantially co-planar, not only effectively increasing the process conformity rate of the redistribution layer 260, but also incurring lower manufacturing cost. For example, the co-planar design may enable coatings such as a dielectric layer 262 (shown in FIG. 2H) to have a substantially uniform thickness, which may simplify a coating process, and may enable the exposing energy to be consistent in an exposing process that may be used, for example, to create openings 2621 (shown in FIG. 2I). In this embodiment, the method for manufacturing the chip package structure 200 includes the following steps.

Referring to FIG. 2A, a substrate 210 is provided, wherein the substrate preferably is an organic substrate or a silicon substrate. Next, as indicated in FIG. 2B, a through hole 212 is formed on the substrate 210 to form a plurality of pre-patterned structures 214, wherein each of the pre-patterned structures 214 includes a circuit 216, a first surface 214a, an upper surface 214b opposite to the first surface 214a, and a side surface extending between the first surface 214a and the upper surface 214b. At least one of the pre-patterned structures 214 may include a slot 2141 on the first surface 214a, where the slot 2141 exposes a part of the circuit 216. At least one of the pre-patterned structures 214 may include another slot 2143 on the upper surface 214b, where the another slot 2143 exposes another part of the circuit 216. The at least one of the pre-patterned structures 214 may include multiple interconnected trace layers embedded between the first surface 214a and the upper surface 214b. The multiple interconnected trace layers may be interconnected, such as by vias.

As indicated in FIG. 2C, a chip module is provided, wherein the chip module includes a chip 220 having an active surface 220a and at least one pad 222 disposed on the active surface 220a. Moreover, the chip 220 and the pre-patterned structures 214 are placed on a counterpart carrier 230 that may have an adhesive layer 232, so that the chip 220 is accommodated in the through hole 212, and the pre-patterned structures 214 are disposed around the chip 220. As the through hole 212 is slightly larger than the chip 220, a gap is formed between the chip 220 and the pre-patterned structures 214.

Referring to FIG. 2D, a filling material layer 240 is formed for encapsulating the chip 220 and the pre-patterned structures 214. Meanwhile, the filling material layer 240 is further disposed in the gap between the chip 220 and each of the pre-patterned structures 214. The filling material layer 240 encapsulates the upper surface of the chip 220, the side surface of the chip 220, the upper surface 214b of each of the pre-patterned structures 214, and the side surface of each of the pre-patterned structures 214. As indicated in FIG. 2D, the filling material layer 240 includes a second surface 240a and an upper surface 240b opposite the second surface 240a. The active surface 220a, each first surface 214a, and the second surface 240a are substantially co-planar.

In FIG. 2E, a hole 2401 may be formed in the filling material layer 240, where the hole 2401 penetrates to the another slot 2143 (illustrated in FIG. 2B) from the upper surface 240b. A conductive material 2402 may be placed in the hole 2401.

Referring to FIG. 2F, a process carrier 250 including an adhesive layer 252 may be disposed on the upper surface 240b (illustrated in FIG. 2D), and the counterpart carrier 230 including the adhesive layer 232 may be removed to expose the active surface 220a, each first surface 214a, and the second surface 240a.

Then, the process carrier 250, the filling material layer 240, the chip 220, and the pre-patterned structures 214 encapsulated by the filling material layer 240 are inverted as indicated in FIG. 2G.

Next, a redistribution layer 260 (illustrated in FIG. 2M) is disposed on the active surface 220a, each first surface 214a, and the second surface 240a to electrically connect the chip 220 and each circuit 216. The redistribution layer 260 passes through the slot 2141 (illustrated in FIG. 2B) to electrically connect to a part of the circuit 216, and is electrically connected to the chip 220 through the pad 222 (illustrated in FIG. 2C). In this embodiment, the formation of the redistribution layer 260 includes the following steps. As indicated in FIG. 2H, a first dielectric layer 262 is formed, where the first dielectric layer 262 and the filling material layer 240 may be made from the same or different materials. In FIG. 2I, first openings 2621 and 2623 of the first dielectric layer 262 are formed, where the first opening 2621 corresponds to the slot 2141 that exposes a part of the circuit 216, and the first opening 2623 exposes the pad 222. The first openings 2621 and 2623 are preferably formed by way of exposing and developing, but may also be formed by other methods such as laser drilling, mechanical drilling, or punching. Next, as indicated in FIG. 2J, a patterned conductive layer 264 is disposed on a top surface of the first dielectric layer 262, side-walls of the first openings 2621 and 2623, the exposed pad 222, and the exposed part of the circuit 216. Then, as indicated in FIG. 2K, a second dielectric layer 266 is disposed on the patterned conductive layer 264 and the first dielectric layer 262. In FIG. 2L, a plurality of second openings 2661 are formed on the second dielectric layer 262 for exposing the patterned conductive layer 264 (illustrated in FIG. 2J). A conductive material 2662 may be placed in second openings 2661. The second dielectric layer 266 and the filling material layer 240 may be made from the same or different materials.

Referring to FIG. 2M, a plurality of external connectors 272 may be disposed on the conductive material 2662, and a plurality of external connectors 274 may be disposed on the conductive material 2402 to form a package having the chip package structure 200. The external connectors 272 and 274 are preferably solder bumps or solder balls.

Second Embodiment

Figure 4:
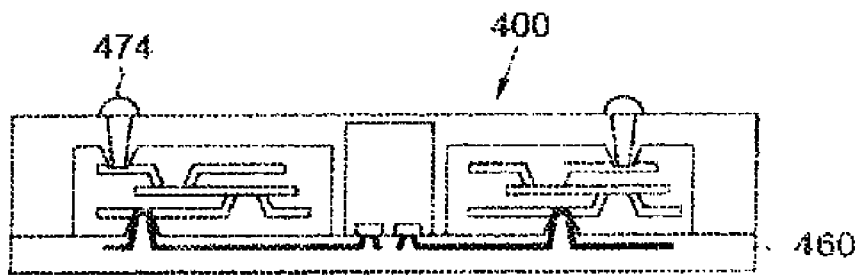
FIG. 4 shows a schematic view of a chip package structure according to a second embodiment of the invention.

Compared with the first embodiment, this second embodiment of the invention omits the forming a plurality of second openings 2661 on the second dielectric layer 262 and accommodating the conductive material 2662 in a plurality of second openings 2661 (shown in FIG. 2L), and omits disposing a plurality of external connectors 272 on the conductive material 2662 (shown in FIG. 2M) to form a package having the chip package structure 400 of FIG. 4. That is, the manufacturing method of the chip package structure 400 of this second embodiment of the invention includes the processing in FIGS. 2A through 2K and a part of the processing in FIG. 2M. The redistribution layer 460 of the chip package structure 400 of FIG. 4 does not have an opening, no external connector is disposed on the corresponding side of the chip package structure 400, and the external connector 474 disposed on another side of the chip package structure 400 may provide electrical connectivity to circuitry outside the chip package structure 400.

Third Embodiment

Figure 5:
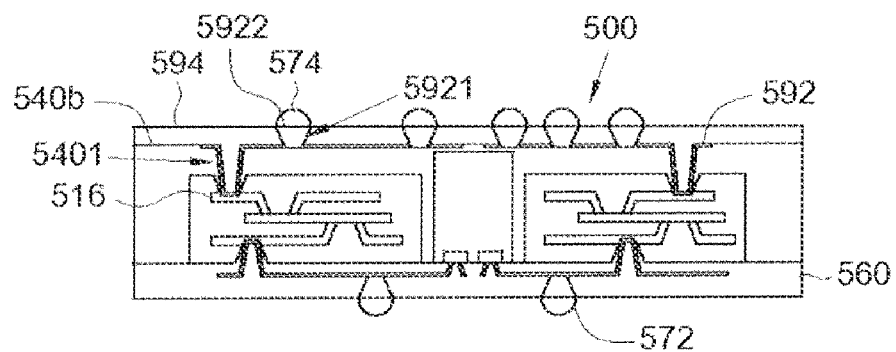
FIG. 5 shows a schematic view of a chip package structure according to a third embodiment of the invention.

Compared with the first embodiment, this third embodiment of the invention omits the forming the hole 2401 on the filling material layer 240 and accommodating the conductive material 2402 (shown in FIG. 2E). In this embodiment, the processing shown in FIG. 2E is replaced by the following processing. Referring to FIG. 5, a conductive layer 592 is disposed on an upper surface 540b of the filling material layer 540, a side-wall of the hole 5401 on the filling material layer 540, and a part of the circuit 516 exposed from the hole 5401. In addition, a dielectric layer 594 is disposed on the conductive layer 592, where the dielectric layer 594 and the filling material layer 540 may be made from the same or different materials. The dielectric layer 594 has a plurality of openings 5921, which expose the conductive layer 592. The openings 5921 are preferably formed by way of exposing and developing, but may also be formed by other methods such as laser drilling, mechanical drilling, or punching in the present process. Furthermore, the conductive material 5922 is filled in the openings 5921. That is, the manufacturing method of the chip package structure 500 of this third embodiment of the invention not only includes the processing shown in FIGS. 2A through 2D, a part of the processing shown in FIG. 2E, and the processing shown in FIGS. 2F through 2M, but also includes the steps of forming the conductive layer 592, forming the dielectric layer 594 having a plurality of openings 5921, and interposing the conductive material 5922 into the openings 5921. Compared with the first embodiment, one side of the chip package structure 500 of this third embodiment of the invention may have more external connectors 574.

Fourth Embodiment

Figure 6:
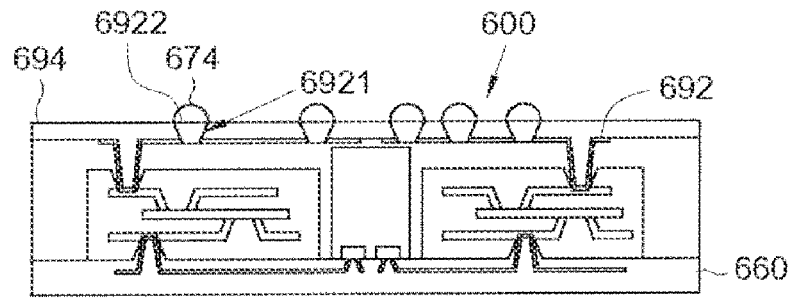
FIG. 6 shows a schematic view of a chip package structure according to a fourth embodiment of the invention.

Compared with the third embodiment, this fourth embodiment of the invention omits forming a plurality of second openings 2661 on the second dielectric layer 262 and accommodating the conductive material 2662 in a plurality of second openings 2661 (shown in FIG. 2L), and omits disposing a plurality of external connectors 272 on the conductive material 2662 (shown in FIG. 2M) to form a package having the chip package structure 600 of FIG. 6. That is, the manufacturing method of the chip package structure 600 of the present embodiment of the invention not only includes the processing shown in FIGS. 2A through 2D, a part of the processing shown in FIG. 2E, the processing shown in FIGS. 2F through 2K, and a part of the processing shown in FIG. 2M, but also includes forming the conductive layer 692, forming the dielectric layer 694 having a plurality of openings 6921, and interposing the conductive material 6922 into the openings 6921. Compared with the third embodiment, the redistribution layer 660 of this fourth embodiment of the invention does not have an opening, so the corresponding side of the chip package structure 600 does not have an external connector. The external connector 674 disposed on another side of the chip package structure 600 may provide electrical connectivity to circuitry outside the chip package structure 600. Compared with the first embodiment, another side of the chip package structure 600 of FIG. 6 may also have more external connectors 674.

Fifth Embodiment

Figure 3A:
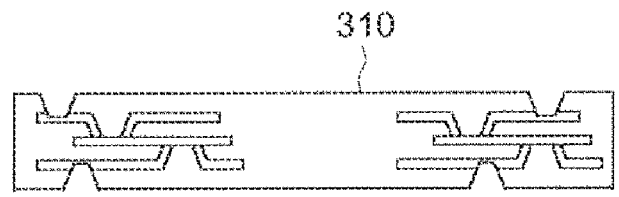
FIGS. 3A through 3N are schematic views showing a method for manufacturing a chip package structure according to a fifth embodiment of the invention.
Figure 3B:
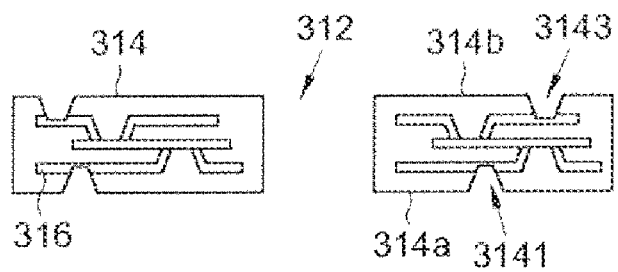
Figure 3C:
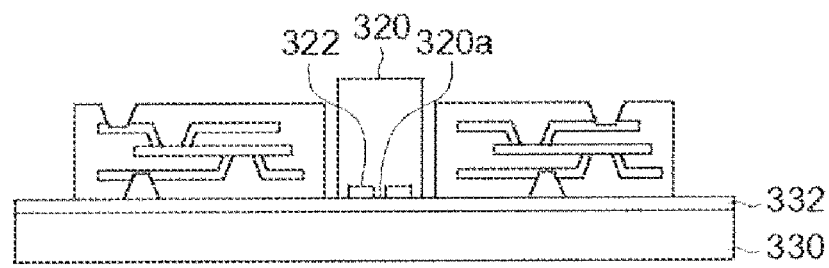
Figure 3D:
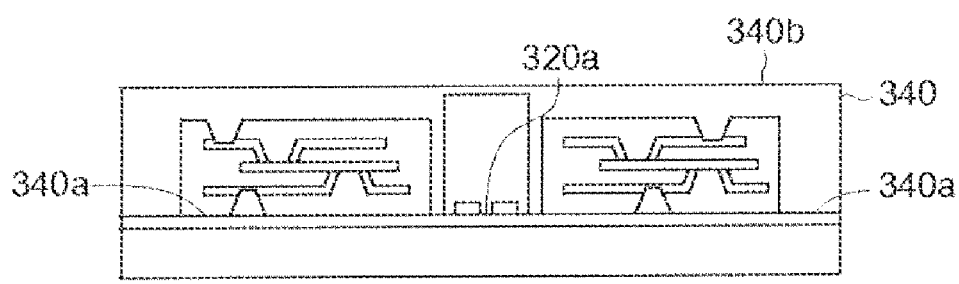
Figure 3E:
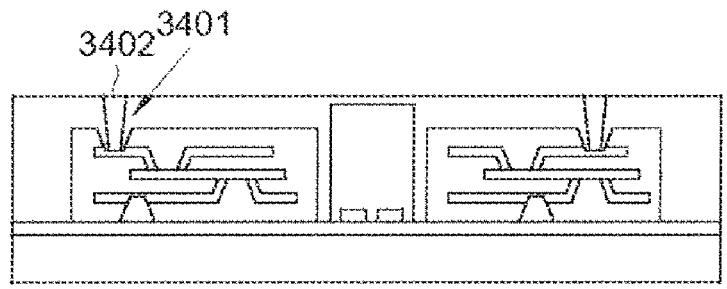
Figure 3F:
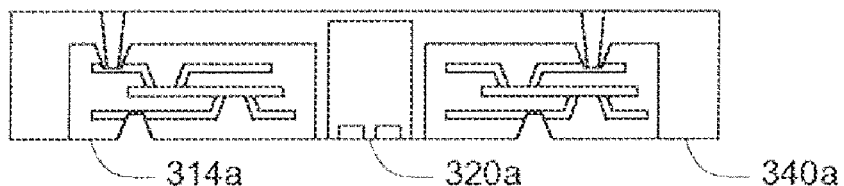
Figure 3G:
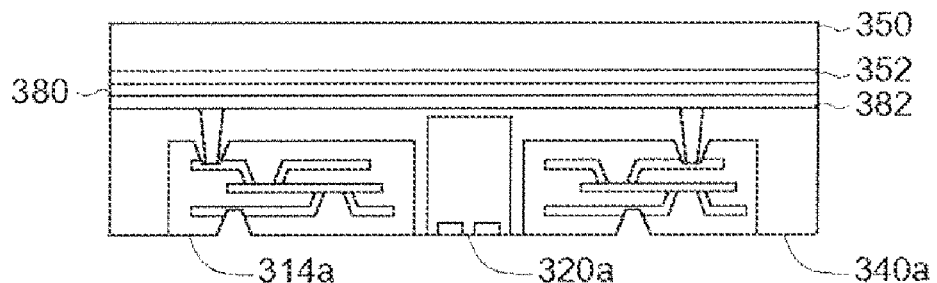
Figure 3H:
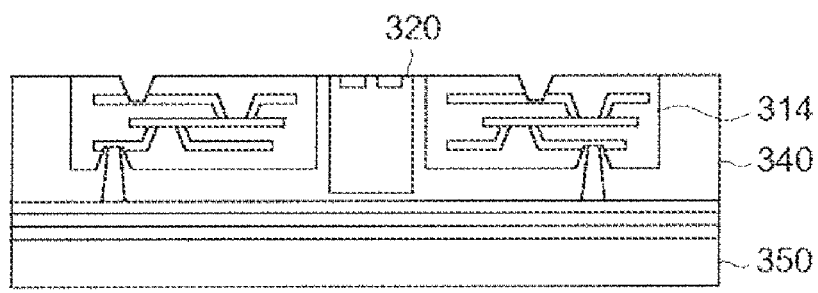
Figure 3I:
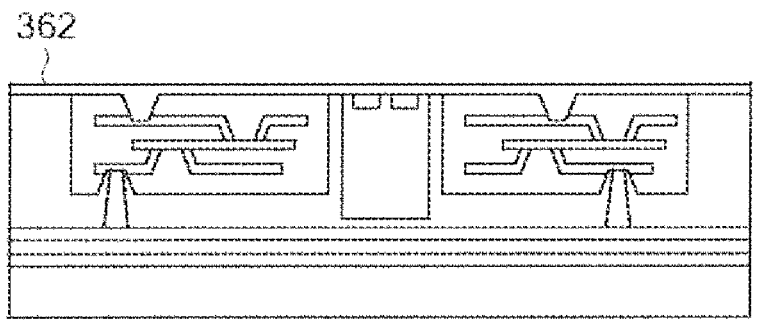
Figure 3J:
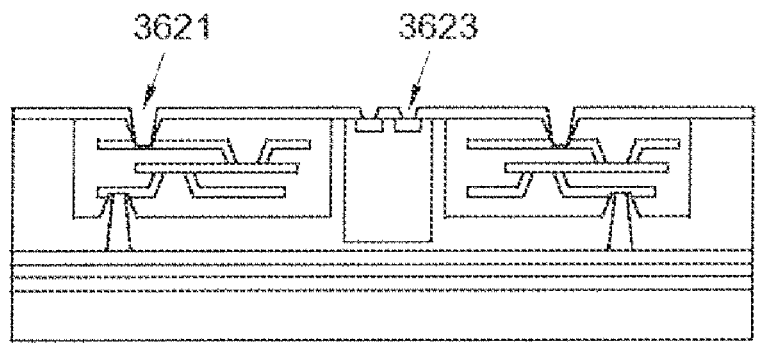
Figure 3K:
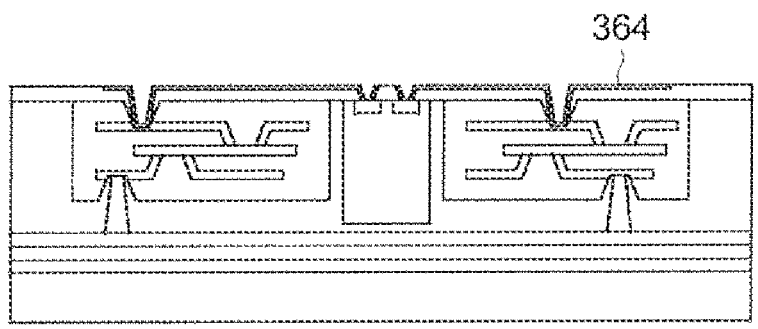
Figure 3L:
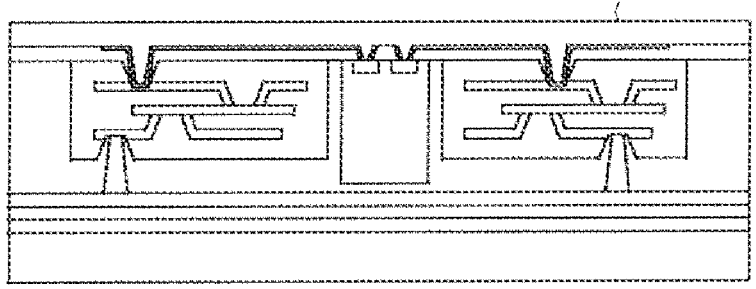
Figure 3M:
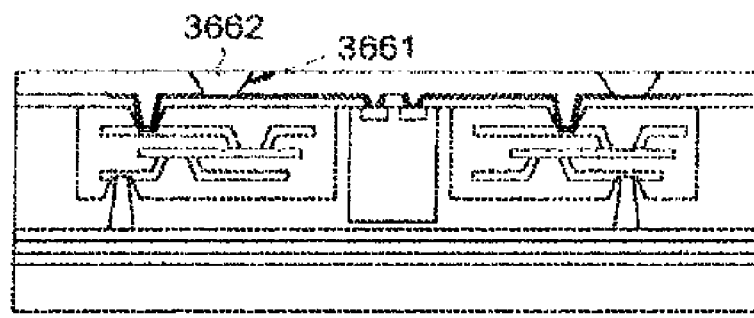
Figure 3N:
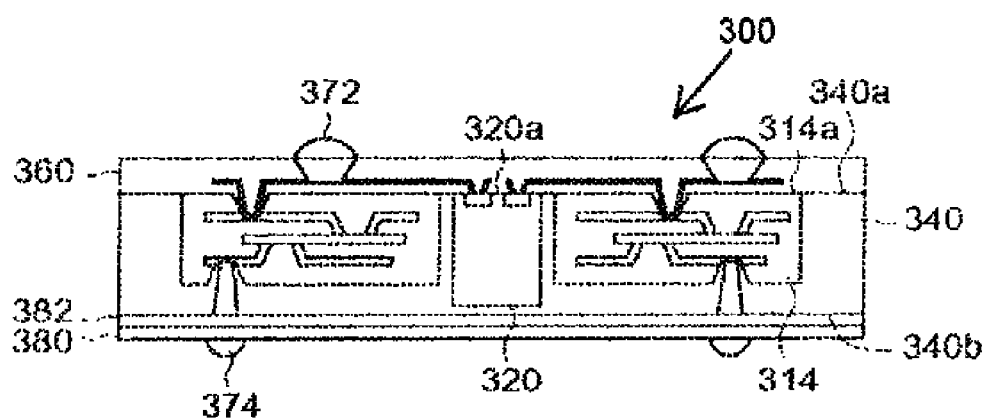

Referring to FIG. 3N, a schematic view of a method for manufacturing a chip package structure according to a fifth embodiment of the invention is shown. The chip package structure 300 includes a chip module, a plurality of pre-patterned structures 314, a filling material layer 340, a redistribution layer 360, and a protection layer 380. The protection layer 380 may be disposed on an adhesive layer 382, and the adhesive layer 382 may be disposed on an upper surface 340b of the filling material layer 340 so that the adhesive layer 382 connects the protection layer 380 and the filling material layer 340. The chip module includes a chip 320 including an active surface 320a, an upper surface opposite the active surface 320a, and a side surface extending between the active surface 320a and the upper surface of the chip 320. The pre-patterned structures 314 are disposed around the chip 320. Also, referring to FIG. 3B, each of the pre-patterned structure 314 includes a circuit 316, a first surface 314a, an upper surface 314b opposite the first surface 314a, and a side surface extending between the first surface 314a and the upper surface 314b. In FIG. 3N, the filling material layer 340 encapsulates the chip 320 and the pre-patterned structures 314. The filling material layer 340 encapsulates the upper surface of the chip 320, the side surface of the chip 320, the upper surface 314b of each of the pre-patterned structures 314, and the side surface of each of the pre-patterned structures 314. The filling material layer 340 has a second surface 340a and an upper surface 340b, and the active surface 320a, each first surface 314a, and the second surface 240a are substantially co-planar. The filling material layer 340 may be made from a photo-imageable or a non-photo-imageable material. This material is preferably but not limited to a molding compound, and other structural materials which can be used as fillers are also applicable to embodiments of the invention. The redistribution layer 360 is disposed on the active surface 320a, each first surface 314a, and the second surface 340a, and electrically connects the chip 320 and each circuit 314. The adhesive layer 382 is disposed on another second surface 340b, and the protection layer 380 is disposed on the adhesive layer, wherein the adhesive layer 382 is used for connecting the protection layer 380 and the filling material layer 340. Preferably, the protection layer 380 is a thermal fin. Furthermore, the chip package structure 300 further includes a plurality of external connectors 372 and 374 respectively disposed on the redistribution layer 360 and the filling material layer 340.

The pre-patterned structure 314 of this fifth embodiment of the invention is placed in the structural material around the embedded chip 300 of the chip package structure 300, and serves as a supporting structure of the package, not only increasing the density of electrical connections in small-sized packages, but also incurring lower cost than the conventional through molding compound technology. Furthermore, in this fifth embodiment of the invention, the active surface 220a, each first surface 214a, and the second surface 240a are substantially co-planar, not only effectively increasing the process conformity rate of the redistribution layer 360, but also incurring lower manufacturing cost. For example, the co-planar design may enable coatings such as a dielectric layer 362 (shown in FIG. 3I) to have a substantially uniform thickness, which may simplify a coating process, and may enable the exposing energy to be consistent in an exposing process that may be used, for example, to create openings 3621 (shown in FIG. 3J). In this embodiment, the method for manufacturing the chip package structure 300 includes the following steps.

Referring to FIG. 3A, a substrate 310 is provided, wherein the substrate preferably is an organic substrate or a silicon substrate. Next, as indicated in FIG. 3B, a through hole 312 is formed on the substrate 310 to form a plurality of pre-patterned structures 314, wherein each of the pre-patterned structure 314 includes a circuit 316, a first surface 314a, an upper surface 314b opposite to the first surface 314a, and a side surface extending between the first surface 314a and the upper surface 314b. At least one of the pre-patterned structures 314 may include a slot 3141 on the first surface 314a, wherein the slot 3141 exposes a part of the circuit 316. At least one of the pre-patterned structures 314 may include another slot 3143 on the upper surface 314b, where the another slot 3143 exposes another part of the circuit 316. The at least one of the pre-patterned structures 314 may include multiple interconnected trace layers embedded between the first surface 314a and the upper surface 314b. The multiple interconnected trace layers may be interconnected, such as by vias.

As indicated in FIG. 3C, a chip module is provided, wherein the chip module includes a chip 320 having an active surface 320a and at least one pad 322 disposed on the active surface 320a. Moreover, the chip 320 and the pre-patterned structures 314 are placed on a counterpart carrier 330 that may have an adhesive layer 332, so that the chip 320 is accommodated in the through hole 312, and the pre-patterned structures 314 are disposed around the chip 320. As the through hole 312 is slightly larger than the chip 320, a gap is formed between the chip 320 and the pre-patterned structures 314.

Referring to FIG. 3D, a filling material layer 340 is formed for encapsulating the chip 320 and the pre-patterned structures 314. Meanwhile, the filling material layer 340 is further disposed in the gap between the chip 320 and each of the pre-patterned structures 314. The filling material layer 340 encapsulates the upper surface of the chip 320, the side surface of the chip 320, the upper surface 314b of each of the pre-patterned structures 314, and the side surface of each of the pre-patterned structures 314. The filling material layer is made from a photo-imageable or a non-photo-imageable material. This material is preferably but not limited to a molding compound, and other structural materials which can be used as fillers are also applicable to embodiments of the invention. As indicated in FIG. 3D, the filling material layer 340 includes a second surface 340a and an upper surface 340b opposite to the second surface 340a. The active surface 320a, each first surface 314a, and the second surface 340a are substantially co-planar.

In FIG. 3E, a hole 3401 may be formed in the filling material layer 340, where the hole 3401 penetrates to the another slot 3143 (illustrated in FIG. 3B) from the upper surface 340b. A conductive material 3402 may be placed in the hole 3401.

Referring to FIG. 3F, the counterpart carrier 330 including the adhesive layer 332 may be removed to expose the active surface 320a, each first surface 314a, and the second surface 340a.

Next, in FIG. 3G, a protection layer 380, an adhesive layer 382, and a process carrier 350 including an adhesive layer 352 may be sequentially stacked on the upper surface 340b (illustrated in FIG. 3D). The adhesive layer 382 connects the protection layer 380 and the filling material layer 340, and the adhesive layer 352 is connects the protection layer 380 and the process carrier 350.

Then, the process carrier 350 including an adhesive layer 352, the protection layer 380, the adhesive layer 382, the filling material layer 340, the chip 320, and the pre-patterned structures 314 encapsulated by the filling material 340 are inverted as indicated in FIG. 3H.

Next, a redistribution layer 360 (illustrated in FIG. 3N) is disposed on the active surface 320a, each first surface 314a, and the second surface 340a to electrically connect the chip 320 and each circuit 316 (illustrated in FIG. 3B). The redistribution layer 360 passes through the slot 3141 (illustrated in FIG. 3B) to electrically connect to part of the circuit 316, and is electrically connected to the chip 320 through the pad 322 (illustrated in FIG. 3C). In this embodiment, the formation of the redistribution layer 360 includes the following steps. As indicated in FIG. 3I, a first dielectric layer 362 is formed, where the first dielectric layer 362 and the filling material layer 340 may be made from the same or different materials. In FIG. 3J, first openings 3621 and 3623 are formed on the first dielectric layer 362, where the first opening 3621 corresponds to the slot 3141 (illustrated in FIG. 3B) that exposes a part of the circuit 316, and the first opening 3623 exposes the pad 322 (illustrated in FIG. 3C). The first openings 3621 and 3623 are preferably formed by way of exposing and developing, but may also be formed by other methods such as laser drilling, mechanical drilling, or punching. Next, as indicated in FIG. 3K, a patterned conductive layer 364 is disposed on a top surface of the first dielectric layer 362, side-walls of the first openings 3621 and 3623, the exposed pad 322 (illustrated in FIG. 3C), and the exposed part of the circuit 316. Then, as indicated in FIG. 3L, a second dielectric layer 366 is disposed on the patterned conductive layer 364 (illustrated in FIG. 3K) and the first dielectric layer 362 (illustrated in FIG. 3J), where the second dielectric layer 366 and the filling material layer 340 may be made from the same or different materials. In FIG. 3M, a plurality of second openings 3661 are formed on the second dielectric layer 362 to expose the patterned conductive layer 364 (illustrated in FIG. 3J) and to accommodate a conductive material 3662. The second opening 3661 is preferably formed by way of exposing and developing, but may also be formed by other methods such as laser drilling, mechanical drilling, or punching.

Referring to FIG. 3N, a plurality of external connectors 372 may be disposed on the conductive material 3662, and a plurality of external connectors 374 may be disposed on the conductive material 3402 to form a package having the chip package structure 300. The external connector 372 and 374 are preferably solder bumps or solder balls.

Compared with the fifth embodiment, another embodiment of the invention omits forming a plurality of second openings 3661 on the second dielectric layer 362 and accommodating the conductive material 3662 in a plurality of second openings 3661 (shown in FIG. 3M), and omits disposing a plurality of external connectors 372 on the conductive material 3662 (shown in FIG. 3N). That is, the method for manufacturing a chip package structure according to another embodiment of the invention includes the processing shown in FIGS. 3A through 3L and a part of the processing shown in FIG. 3M.

Compared with the fifth embodiment, yet another embodiment of the invention includes the processing shown in FIGS. 3A through 3D, a part of the processing shown in FIG. 3E, and the processing shown in FIGS. 3F through 3N, and further includes processing similar to that described for the third embodiment such as forming the conductive layer, forming the dielectric layer having a plurality of holes, and interposing the conductive material into the gaps to replace the above processing shown in FIG. 3E of forming the hole 3401 on the filling material layer 340 and accommodating the conductive material 3402. Compared with the fifth embodiment, one side of the chip package structure of the yet another embodiment may also have more external connectors.

Compared with the fifth embodiment, a further embodiment omits forming a plurality of second openings 3661 on the second dielectric layer 362 and accommodating the conductive material 3662 in a plurality of second openings 3661 (shown in FIG. 3M), and omits disposing a plurality of external connectors 372 on the conductive material 3662 (shown in FIG. 3N). That is, the method for manufacturing a chip package structure of the further embodiment not only includes the processing shown in FIGS. 3A through 3D, a part of the processing shown in FIG. 3E, the processing shown in FIGS. 3F through 3L and a part of the processing shown in FIG. 3N, and but also includes processing similar to that described for the fourth embodiment such as forming the conductive layer, forming the dielectric layer having a plurality of holes, and interposing the conductive material in the openings. Compared with the yet another embodiment, the redistribution layer of the further embodiment does not have an opening, so the corresponding side of the chip package structure does not have an external connector. The external connector disposed on another side of the chip package structure may provide electrical connectivity to circuitry outside the chip package structure. Compared with the fifth embodiment, another side of the further chip package structure may also have more external connectors.

The chip package structure disclosed in the above embodiments is a single-chip package structure, but can be a multi-chip package structure if the chip module includes a plurality of chips. There are a plurality of pre-patterned structures disposed around each chip. Furthermore, the active surface of the chips, the second surface of the filling material layer, and the first surfaces of the pre-patterned structures are substantially co-planar.

Figure 7:
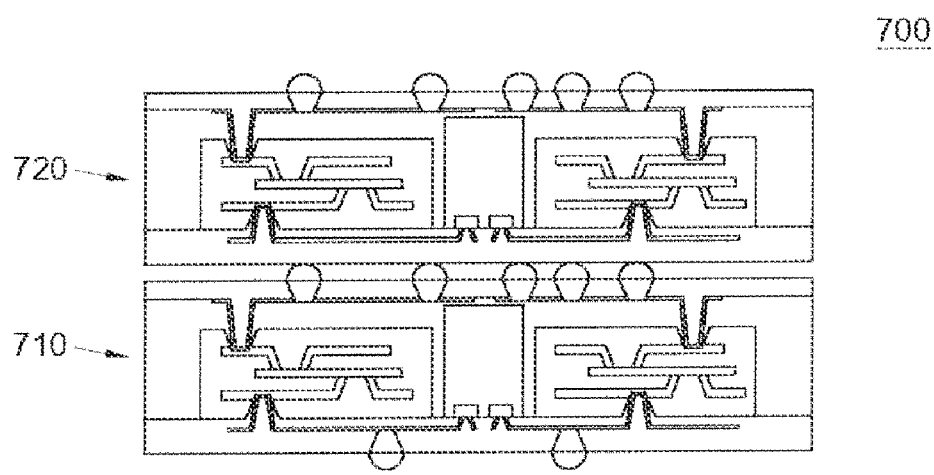
FIG. 7 shows a schematic view of a multi-chip package structure according to a sixth embodiment of the invention.

Furthermore, the single-chip or the multi-chip package structure disclosed in the above embodiments can be stacked to form a package-on-package (POP) package, which includes a plurality of identical or different packages sequentially stacked. Referring to FIG. 7, a multi-chip package structure according to a sixth embodiment of the invention is shown. In this embodiment, the package-on-package structure 700 includes a first package 710 and a second package 720. The second package 720 is attached above the first package 710, and at least one of the first package 710 and the second package 720 can be a single-chip or a multi-chip package structure disclosed in the above described embodiments.

The chip package structure disclosed in the above described embodiments of the invention has many advantages as exemplified below.

1. The pre-patterned structure placed in the structural material around the embedded chip serves as a supporting structure of the package, not only increasing the density of electrical connection in small-sized packages, but also incurring lower cost than conventional through molding compound technology.

2. The design that the active surface of the chip, each first surface of each pre-patterned structure, and the second surface of the filling material layer are substantially co-planar effectively increases the process conformity rate of the redistribution layer and reduces the manufacturing cost. For example, the co-planar design may enable coatings such as a dielectric layer 262 (shown in FIG. 2H) to have a substantially uniform thickness, which may simplify a coating process, and may enable the exposing energy to be consistent in an exposing process that may be used, for example, to create openings 2621 (shown in FIG. 2I).

3. Embodiments of the invention are very flexible, and are applicable to single-chip and multi-chip package structures as well as fan-out and fan-in package structures. Package structures of embodiments of the invention can be conveniently stacked to form a package-on-package (POP) package.

While the invention has been described by way of example and in terms of several embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A chip package structure, comprising:
a chip module comprising a chip, wherein the chip includes an upper surface, a side surface, and an active surface opposite the upper surface of the chip;
a plurality of pre-patterned structures disposed around the chip, wherein each of the pre-patterned structures includes a circuit, a first surface, an upper surface opposite the first surface, and a side surface;
a filling material layer that encapsulates the chip and the plurality of pre-patterned structures, wherein:
the filling material layer encapsulates the upper surface of the chip, the side surface of the chip, the upper surface of each of the plurality of pre-patterned structures, and the side surface of each of the plurality of pre-patterned structures;
the filling material layer includes a second surface; and
the active surface, the first surface of each of the plurality of pre-patterned structures, and the second surface are substantially co-planar; and
a redistribution layer disposed on the active surface, the first surface of each of the plurality of pre-patterned structures, and the second surface, wherein the redistribution layer electrically connects the chip and the circuit in each of the plurality of pre-patterned structures.

2. The chip package structure according to claim 1, wherein at least one of the plurality of pre-patterned structures includes a slot on the first surface, the slot exposes a part of the circuit, and the redistribution layer passes through the slot to be electrically connected to the part of the circuit.

3. The chip package structure according to claim 2, wherein the at least one of the plurality of pre-patterned structures includes multiple interconnected trace layers embedded between the first surface and the upper surface of the at least one of the plurality of pre-patterned structures.

4. The chip package structure according to claim 2, wherein:
the chip comprises at least one pad;
the redistribution layer is electrically connected to the chip through the at least one pad; and
the redistribution layer comprises:
a first dielectric layer having a plurality of first openings, wherein the first openings expose the at least one pad and the part of the circuit;
a patterned conductive layer disposed on an upper surface of the first dielectric layer, a side-wall of the first openings, the exposed at least one pad, and the part of the circuit; and
a second dielectric layer disposed on the patterned conductive layer and the first dielectric layer.

5. The chip package structure according to claim 4, wherein the second dielectric layer has a plurality of second openings for exposing the patterned conductive layer and accommodating a conductive material.

6. The chip package structure according to claim 5, wherein the chip package structure further comprises a plurality of external connectors disposed on the conductive material.

7. The chip package structure according to claim 2, wherein at least one of the plurality of pre-patterned structures includes another slot on the upper surface opposite the first surface, and the another slot exposes another part of the circuit.

8. The chip package structure according to claim 7, wherein the filling material layer further includes:
an upper surface opposite to the second surface; and
a hole that penetrates to the another slot from the upper surface of the filling material layer, and that accommodates a conductive material.

9. The chip package structure according to claim 8, wherein the chip package structure further comprises a plurality of external connectors disposed on the conductive material.

10. The chip package structure according to claim 7, wherein the filling material layer further includes:
an upper surface opposite to the second surface; and
a hole that penetrates to the another slot from the upper surface of the filling material layer; and
wherein the chip package structure further comprises:
a conductive layer disposed on the upper surface of the filling material layer, a side-wall of the hole, and the another part of the circuit; and
a dielectric layer disposed on the conductive layer.

11. The chip package structure according to claim 10, wherein the dielectric layer has a plurality of openings for exposing the conductive layer and accommodating a conductive material.

12. The chip package structure according to claim 7, wherein the filling material layer further includes:
an upper surface opposite to the second surface; and
a hole that penetrates to the another slot from the upper surface of the filling material layer; and
wherein the chip package structure further comprises:
an adhesive layer disposed on the upper surface of the filling material layer; and a protection layer disposed on the adhesive layer, wherein the adhesive layer connects the protection layer and the filling material layer.

13. The chip package structure according to claim 12, wherein the chip package structure further comprises a plurality of external connectors disposed on the conductive material.

14. The chip package structure according to claim 12, wherein the protection layer is a thermal fin.

15. The chip package structure according to claim 1, wherein the filling material layer is a molding compound.

16. The chip package structure according to claim 1, wherein the chip module comprises a plurality of chips, so that the chip package structure is a multi-chip package structure.

17. The chip package structure according to claim 1, wherein the filling material layer is made from a photo-imageable material.

18. A method of forming a chip package structure, comprising:
    providing a plurality of separate pre-patterned structures, wherein each of the plurality of separate pre-patterned structures includes a circuit, a first surface, an upper surface opposite the first surface, and a side surface;
    providing a chip module including a chip, wherein the chip includes an upper surface, a side surface, and an active surface opposite the upper surface of the chip;
    providing a carrier;
    disposing the plurality of separate pre-patterned structures and the chip adjacent to the carrier such that the plurality of separate pre-patterned structures are positioned around the chip;
    forming a filling material layer around the chip and the plurality of separate pre-patterned structures so that:
        the filling material layer substantially covers the upper surface of the chip, the side surface of the chip, the upper surface of each of the plurality of separate pre-patterned structures, and the side surface of each of the plurality of separate pre-patterned structures; and
        a second surface of the filling material layer is substantially co-planar with the active surface and the first surface of each of the plurality of separate pre-patterned structures;
    disposing a redistribution layer on the active surface, the first surface of each of the plurality of separate pre-patterned structures, and the second surface, wherein the redistribution layer electrically connects the chip and the circuit in each of the plurality of separate pre-patterned structures.

19. The method of claim 18, wherein each of the plurality of separate pre-patterned structures includes multiple interconnected trace layers embedded between the first surface and the upper surface of the each of the plurality of separate pre-patterned structures.

20. The method of claim 18, further comprising:
    creating a slot on the first surface of at least one of the plurality of separate pre-patterned structures to expose a part of the circuit, wherein the redistribution layer passes through the slot to electrically connect to the part of the circuit.

* * * * *